United States Patent
Ellis-Monaghan

(10) Patent No.: US 10,818,764 B2
(45) Date of Patent: Oct. 27, 2020

(54) POLY GATE EXTENSION SOURCE TO BODY CONTACT

(71) Applicant: GLOBALFOUNDRIES INC., Grand Cayman (KY)

(72) Inventor: John J. Ellis-Monaghan, Grand Isle, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/520,670

(22) Filed: Jul. 24, 2019

(65) Prior Publication Data

US 2019/0348514 A1 Nov. 14, 2019

Related U.S. Application Data

(62) Division of application No. 15/378,990, filed on Dec. 14, 2016, now Pat. No. 10,424,664.

(51) Int. Cl.
*H01L 29/423* (2006.01)
*H01L 29/06* (2006.01)
*H01L 29/40* (2006.01)
*H01L 29/66* (2006.01)
*H01L 29/78* (2006.01)
*H01L 29/51* (2006.01)

(52) U.S. Cl.
CPC ...... *H01L 29/4238* (2013.01); *H01L 29/0649* (2013.01); *H01L 29/401* (2013.01); *H01L 29/42376* (2013.01); *H01L 29/517* (2013.01); *H01L 29/66477* (2013.01); *H01L 29/78* (2013.01); *H01L 29/783* (2013.01); *H01L 29/0684* (2013.01)

(58) Field of Classification Search
CPC ........... H01L 2924/00; H01L 29/78615; H01L 27/1203; H01L 29/66772; H01L 21/84
USPC .......... 257/347, E29.281, E27.112; 438/149, 438/151
See application file for complete search history.

(56) References Cited

U.S. PATENT DOCUMENTS

| 4,899,202 | A | 2/1990 | Blake et al. |
| 5,405,795 | A | 4/1995 | Beyer et al. |
| 5,591,650 | A | 1/1997 | Hsu et al. |
| 6,307,237 | B1 | 10/2001 | Erstad |

(Continued)

FOREIGN PATENT DOCUMENTS

| TW | 200616031 | 5/2006 |
| TW | 200524159 | 11/2012 |
| WO | 2014046856 | 3/2014 |

OTHER PUBLICATIONS

Taiwanese Notice of Allowance in related TW Application No. 106107767 dated Aug. 24 2018, 3 pages.

(Continued)

*Primary Examiner* — Jonathan Han
(74) *Attorney, Agent, or Firm* — Michael LeStrange; Andrew M. Calderon; Roberts Calderon Safran & Cole, P.C.

(57) ABSTRACT

The present disclosure relates to semiconductor structures and, more particularly, to poly gate extension source to body contact structures and methods of manufacture. The structure includes: a substrate having a doped region; a gate structure over the doped region, the gate structure having a main body and a gate extension region; and a body contact region straddling over the gate extension region and remote from the main body of the gate structure.

20 Claims, 4 Drawing Sheets

(56) References Cited

U.S. PATENT DOCUMENTS

| | | | |
|---|---|---|---|
| 6,353,245 B1 | 3/2002 | Unnikrishnan | |
| 6,387,739 B1* | 5/2002 | Smith, III | H01L 27/1203 |
| | | | 257/E27.112 |
| 6,521,959 B2* | 2/2003 | Kim | H01L 29/78615 |
| | | | 257/397 |
| 6,642,579 B2 | 11/2003 | Fung | |
| 7,084,462 B1* | 8/2006 | Warnock | H01L 27/088 |
| | | | 257/348 |
| 2005/0184343 A1 | 8/2005 | Thornton et al. | |
| 2006/0180861 A1* | 8/2006 | Tsujiuchi | H01L 29/66772 |
| | | | 257/347 |
| 2009/0033395 A1 | 2/2009 | Abadeer et al. | |
| 2011/0079851 A1* | 4/2011 | Li | H01L 21/76283 |
| | | | 257/347 |
| 2012/0049279 A1 | 3/2012 | Shrivastava et al. | |
| 2012/0205744 A1 | 8/2012 | O et al. | |

OTHER PUBLICATIONS

Taiwanese Office Action in related TW Application No. 106107767 dated Jan. 15, 2018, 6 pages.

\* cited by examiner

POLY GATE EXTENSION SOURCE TO BODY CONTACT

FIELD OF THE INVENTION

The present disclosure relates to semiconductor structures and, more particularly, to poly gate extension source to body contact structures and methods of manufacture.

BACKGROUND

Silicon on insulator (SOI) technology uses a layered silicon-insulator-silicon substrate in place of conventional silicon substrates in semiconductor manufacturing, especially microelectronics. This layered structure reduces parasitic device capacitance, thereby improving performance.

As SOI technology continues to become more pervasive in the microelectronics industry, there is a need for a simple and cost effective way to create a source to body contacted device that has low gate capacitance and small area. Typically, for example, body contacted devices in SOI have large gate capacitance or high variability due to channel width variation. In fact, currently used designs of source to body contacted devices in SOI have added expensive processing steps, parasitic gate area structures (e.g., t-body/h-body/u-body), or structures with high width tolerance (L-body), all of which have drawbacks.

SUMMARY

In an aspect of the disclosure, a structure comprises: a substrate having a doped region; a gate structure over the doped region, the gate structure having a main body and a gate extension region; and a body contact region straddling over the gate extension region and remote from the main body of the gate structure.

In an aspect of the disclosure, a structure comprises: a semiconductor on insulator substrate (SOI) having a doped well region; a gate structure formed on the doped well region, the gate structure including a main body having a channel with constant width and a gate extension region extending from the main body; a source region on a first side of the main body of the gate structure and a drain region on a side of the main body of the gate structure; and a diffusion contact body region abutting the source region of the gate structure adjacent to the channel, and straddling the gate extension region of the gate structure and remote from the channel.

In an aspect of the disclosure, a method comprises: forming a gate structure on a substrate, the gate structure formed with a main body over a channel region and a gate extension region extending from the main body; forming diffusion regions on opposing sides of the channel region; and forming a body contact diffusion region over one of the diffusion regions of the main body, remote from the channel region and straddling the gate extension region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to poly gate extension source to body contact structures and methods of manufacture. More specifically, the present disclosure provides a plurality of different poly gate extension source to body contact structures with reduced gate capacitance and tighter width tolerance than conventional T-body, H-body or L-body devices. Advantageously, by implementing the structures described herein, it is possible to provide faster, more compact and better performing analog and digital transistors (FETs), compared to conventional devices.

In embodiments, the structures, e.g., FETs, can be implemented in different SOI devices e.g., logic, microprocessors, analog, amplifiers, LNA's etc. The devices can also be implemented in many different configurations including multiple finger (multi-finger) or single finger versions of a device. Also, and advantageously, the FETs described herein maintain device characteristics without significantly degrading gate capacitance or current tolerances. Also, the source to body contacts allow for overlay tolerance while reducing the gate capacitance compared to conventional structures.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1A:
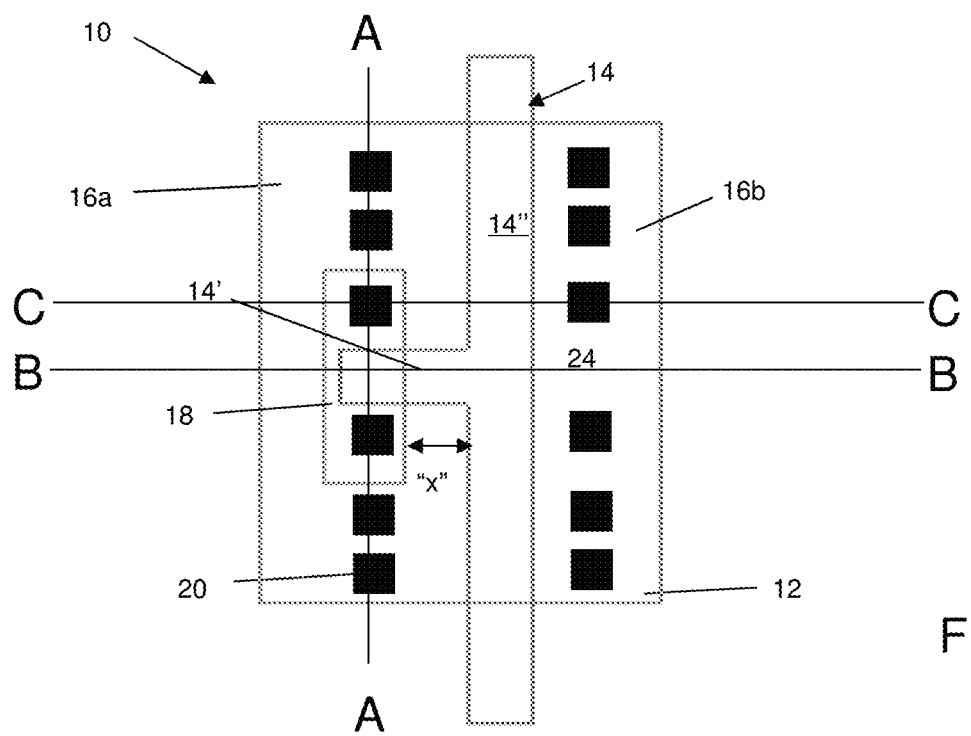
FIGS. 1A and 1B show a structure and respective fabrication processes in accordance with aspects of the present disclosure
Figure 1B:
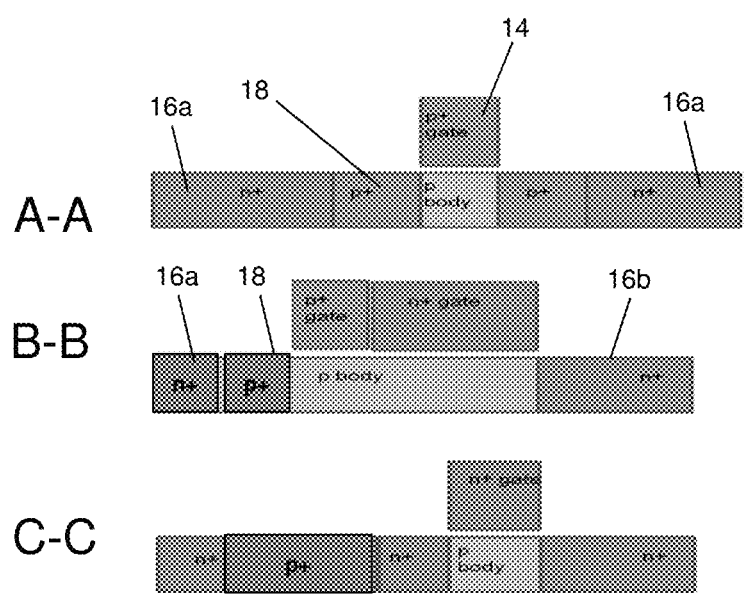

FIGS. 1A and 1B show a structure and respective fabrication processes in accordance with aspects of the present disclosure. More specifically, FIG. 1A shows a top view of the structure 10; whereas, FIG. 1B shows several cross-sectional views of the structure 10, along lines A-A, B-B and C-C of FIG. 1A. The structure 10 can be silicon on insulator (SOI) technologies, which can be used for either nFET or pFET devices (as with each of the aspects described herein). In embodiments, the SOI technologies include a SOI substrate 12 manufactured using known techniques, e.g., Separation by IMplantation of Oxygen (SIMOX) or wafer bonding techniques.

In embodiments, the SOI substrate 12 can be composed of any suitable semiconductor material. For example, the substrate 12 may be composed of any suitable material including, but not limited to, Si, SiGe, SiGeC, SiC, GaAs, InAs, InP, and other III/V or II/VI compound semiconductors. In embodiments, the substrate 12 can include a p+ doped well region as shown by reference number 24; although n-type dopants can also be implemented herein. The doping can be provided by ion implantation or diffusion techniques, known to those of skill in the art such that no further explanation is required herein.

Still referring to FIGS. 1A and 1B, a gate structure 14 is patterned on the substrate 12. In embodiments, the gate structure 14 is a poly gate structure formed by conventional deposition and etching techniques, e.g., reactive ion etching (RIE). For example, a gate dielectric material, e.g., a conventional $SiO_2$ or a high-k dielectric material, is grown or deposited on the substrate 12, followed by a deposition of poly material. In embodiments, the gate dielectric material can be thermally grown or deposited by an atomic layer deposition (ALD) or plasma enhanced chemical vapor deposition (PECVD) process, followed by the deposition of poly material using a CVD process. In embodiments, the gate dielectric material can be a high-k gate dielectric material, e.g., $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof.

After the deposition of the high-k gate dielectric and poly material, a resist formed over the poly material is exposed to energy (light) to form a pattern (opening). An etching process with a selective chemistry, e.g., reactive ion etching (RIE), forms the pattern of the gate structure 14 through the openings of the resist. In embodiments, the gate structure 14 will be patterned into a T-body comprising, e.g., a gate extension region 14' and a main body 14"; although other shapes are also contemplated herein, e.g., H-gate and L-gate. In embodiments, the gate extension region 14' has a width larger than the minimum overlay, and can be as small in length as a minimum lithographic channel length. The poly gate 14 is a minimum allowed dimension under ground rules in order to provide a small parasitic capacitance, compared to conventional gate structures which require a larger footprint to accommodate a body contact due to overlay tolerances as described herein. The characteristics of the gate extension region 14' are similar in other aspects described herein, except for those characteristics noted below.

It should be recognized by those of skill in the art that for the final device to function correctly, separate patterns must be aligned correctly, e.g., contacts, lines and transistors must all line up. To this end, overlay control defines the control of the pattern-to-pattern alignment, helping to monitor layer-to-layer alignment on multi-layer device structures. Misalignment of any kind can cause short circuits and connection failures which, in turn, impact fabrication yield and profit margins. Overlay control has become even more critical because of increasing pattern density, amongst other advances in technologies and for this reason the existing overlay metrology solutions cannot meet total measurement uncertainty (TMU) requirements. For these and other reasons, conventional gate structures cannot be provided at a minimum gate dimension, as it would not be possible to form body contacts within overlay tolerances.

Still referring to FIGS. 1A and 1B, following the resist removal, spacer sidewall material can be formed on the patterned structure (e.g., gate structure 14) by conventional deposition and etching processes, e.g., isotropic etching techniques. After formation of the spacer sidewalls, a source region 16a and drain region 16b are formed on opposing sides of the main body 14" of the gate structure 14. In embodiments, the source region 16a and drain region 16b are formed by conventional doping processes. For example, in embodiments, the source region 16a and drain region 16b can be N+ regions, e.g., Phosphorus, Arsenic, Antimony, etc.; although, it should be understood that the source region 16a and drain region 16b can be P doped regions, e.g., boron, when the substrate is an n-type substrate for making pFETs.

A body contact 18 is formed over the gate extension region 14'. In embodiments, the body contact 18 is a P+ body implant diffusion formed by conventional ion implantation processes; although the body contact 18 can be an N+ body implant diffusion when the substrate is an n-type substrate. As shown in FIG. 1A, for example, the body contact 18 does not overlap the channel region, e.g., under the main body 14" of the gate 14, unlike that of conventional devices. In this way, the channel width can remain constant, compared to conventional L-body or U-body devices. Also, as a result, the source to body contacted device has a low gate capacitance and good dimensional tolerance, compared to conventional devices.

In embodiments, the P+ body implant diffusion is fabricated by forming a resist over the structure and opening a hole, e.g., pattern, over the gate extension region 14', followed by an ion implantation process. The opening will be spaced away from the main body 14" of the gate structure 14. In this way, the P+ body implant diffusion 18 will not overlap or touch with the main body 14" of the gate structure 14; instead, as in each of the aspects described herein, the P+ body implant diffusion will straddle the gate extension region 14' and abut the source n+(p+) diffusion (e.g., source region 16a). Accordingly, the P+ body implant diffusion will be spaced away from the main body 14" of the gate structure 14 by distance "x", which is larger than a lithographic overlay from the drain to source poly channel.

Following the formation of the body contact 18, silicide regions are formed for contact formation, shown generally at doped regions 24. As should be understood by those of skill in the art, the silicide process begins with deposition of a thin transition metal layer, e.g., nickel, cobalt or titanium, over patterned devices (e.g., doped or ion implanted source and drain regions 16a, 16b, 18). After deposition of the material, the structure is heated allowing the transition metal to react with exposed silicon (or other semiconductor material as described herein) in the active regions of the semiconductor device (e.g., source and drain contact region) forming a low-resistance transition metal silicide. Following the reaction, any remaining transition metal is removed by chemical etching, leaving silicide contacts in the active regions of the device and shorting the dopant regions 16a to dopant region 18.

The contacts 20 can be formed by conventional lithography, deposition and chemical mechanical polishing (CMP) steps. For example, a resist formed over an insulator material is exposed to energy (light) to form a pattern (opening). An etching process with a selective chemistry, e.g., RIE, will be used to form one or more trenches in the insulator material through the openings of the resist, exposing the silicide regions. Following the resist removal, conductive material can be deposited by any conventional deposition processes, e.g., CVD processes. In embodiments, the conductive material can be tungsten, as one example. Any residual material on the surface of the insulator material can be removed by conventional CMP processes.

Figure 2:
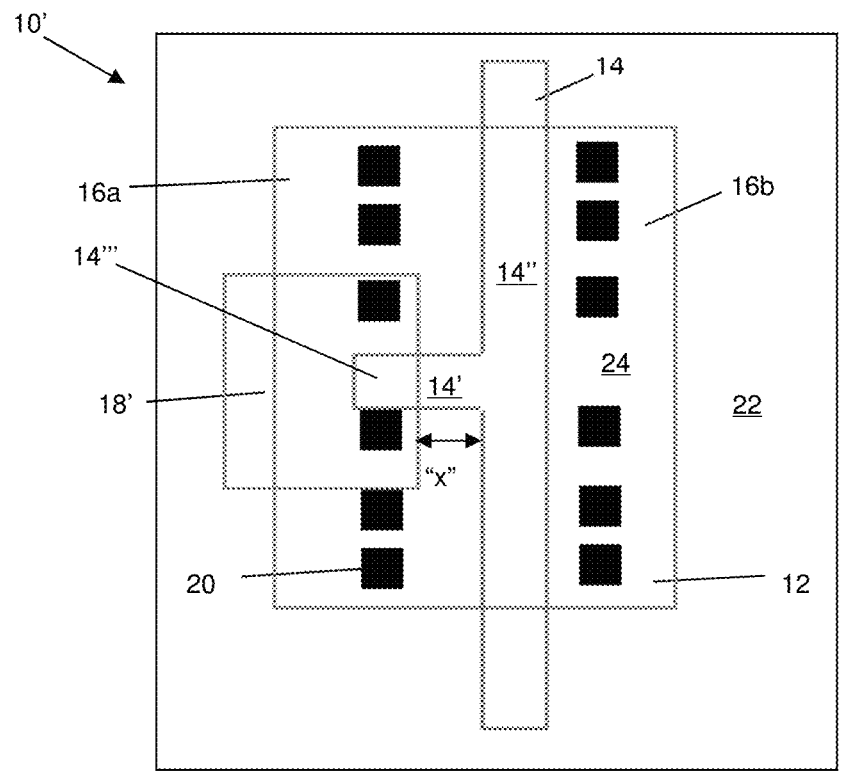
FIG. 2 shows an alternative structure in accordance with aspects of the present disclosure.

FIG. 2 shows an alternative structure in accordance with aspects of the present disclosure. In the structure 10' of FIG. 2, the P+ body implant diffusion, e.g., body contact 18', is formed over an end 14'" of the gate extension region 14', overlapping a shallow trench isolation region 22. In other words, the P+ body implant diffusion, e.g., body contact 18', is not formed entirely within the doped region 24 of the substrate 12. The gate extension region 14', though, is formed entirely within the doped region 24 of the substrate 12.

Figure 3:
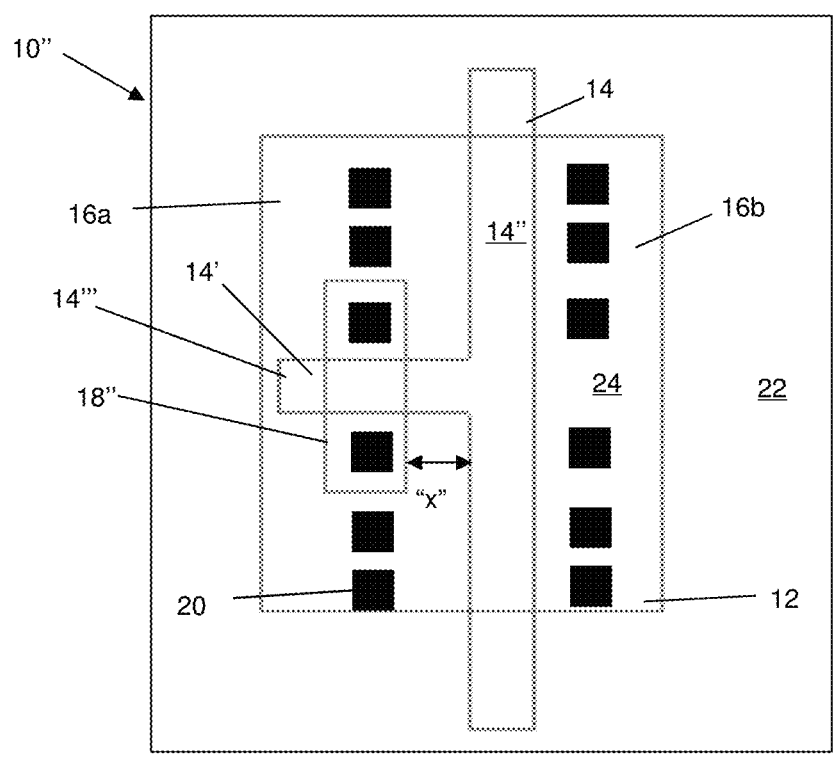
FIG. 3 shows an alternative structure in accordance with aspects of the present disclosure.

FIG. 3 shows an alternative structure in accordance with aspects of the present disclosure. In the structure 10" of FIG. 3, the P+ body implant diffusion, e.g., body contact 18", is formed remotely from an end 14'" of the gate extension region 14'. Also, both the P+ body implant diffusion, e.g., body contact 18", and the gate extension region 14' are formed entirely within the doped region 24 of the substrate 12.

Figure 4:
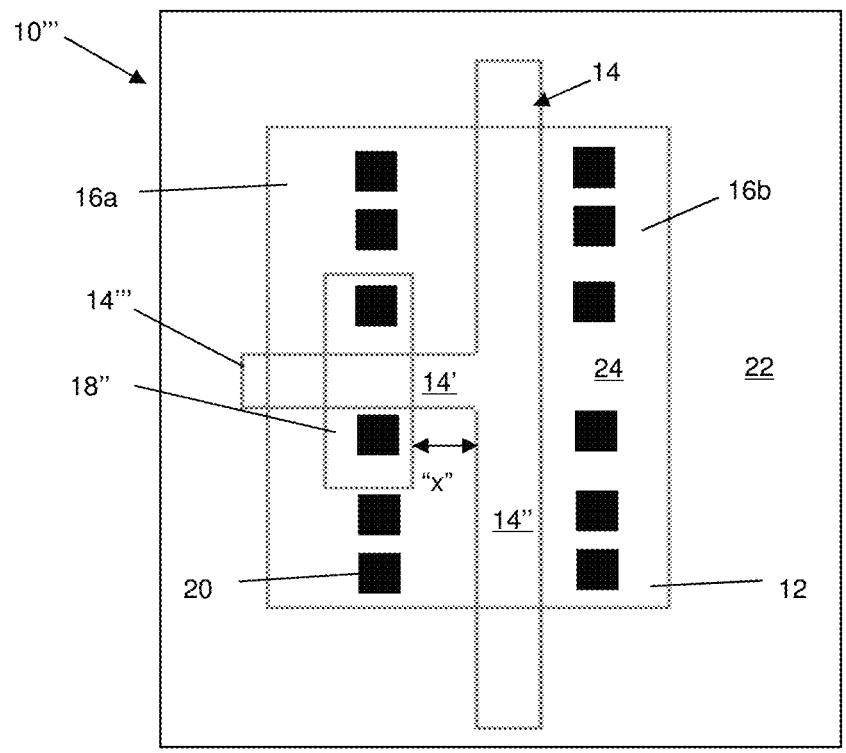
FIG. 4 shows an alternative structure in accordance with aspects of the present disclosure.

FIG. 4 shows an alternative structure in accordance with aspects of the present disclosure. In the structure 10'" of FIG. 4, the P+ body implant diffusion, e.g., body contact 18'", is formed remotely from an end 14'" of the gate extension region 14'. Also, the gate extension region 14' extends outside of the doped region 24 of the substrate 12, e.g., overlapping the shallow trench isolation region 22.

Figure 5:
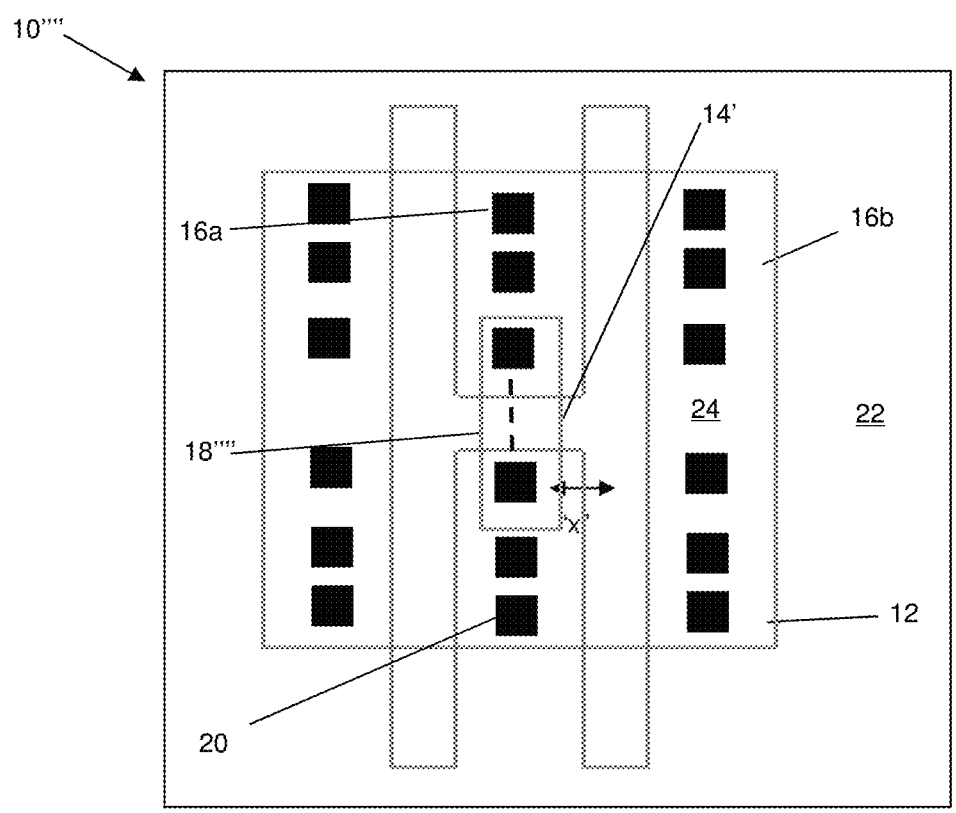
FIG. 5 shows a multi-finger structure in accordance with aspects of the present disclosure.

FIG. 5 shows an alternative structure in accordance with aspects of the present disclosure. In the structure 10"" of FIG. 5, the gate structure 14 is a multi-finger version of the device with the gate extension region 14' connecting the adjacent fingers. It should be understood that the gate extension region 14' can also be two gate extension regions 14', separated from one another as depicted by the dashed line of FIG. 5. In either situation, the P+ body implant diffusion, e.g., body contact 18"", is formed over the gate extension region 14' between the adjacent fingers. In the situation when the gate extension region 14' is shared amongst the adjacent finger, the P+ body implant diffusion, e.g., body contact 18"", will also be shared amongst the adjacent fingers. Also, when the gate extension region 14' is not shared amongst the adjacent finger, the P+ body implant diffusion, e.g., body contact 18"" can be distinct, but in either case a common source region. In these ways, the structure has a body shorted under the small gate extension 14'. The P+ body implant diffusion, e.g., body contact 18"" and the gate extension region 14' are formed entirely within the doped region 24 of the substrate 12.

Figure 6:
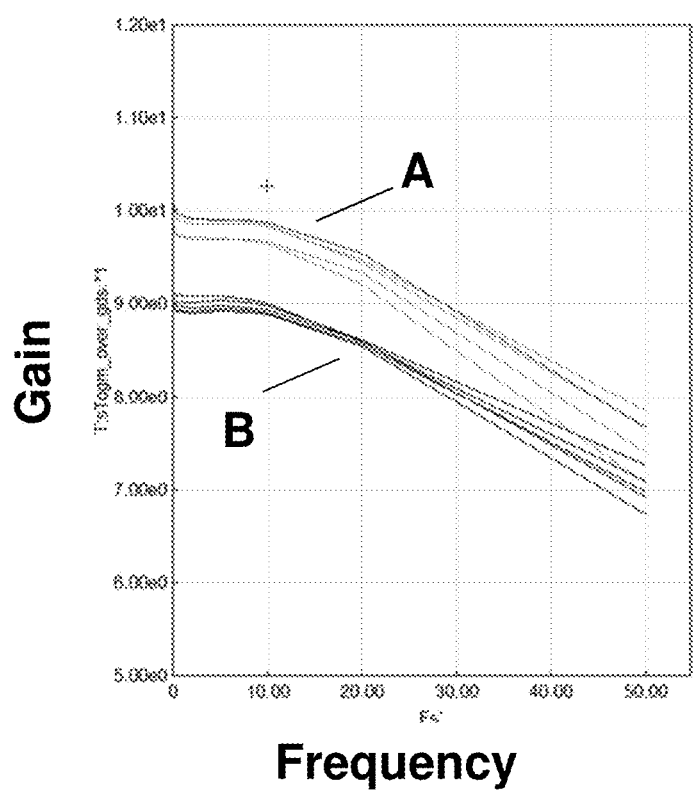
FIG. 6 shows a comparison graph of a conventional device vs. the devices described herein.

FIG. 6 shows a comparison graph of a conventional device vs. the devices described herein. In embodiments, the lines designated as "A" represent the gain of an H-gate, e.g., multi-finger gate implementing the extension source to body contact structures described herein. The lines "B" represent conventional floating contact devices. As shown from FIG. 6, for example, the lines "A" representing the gain of an H-gate, e.g., multi-finger gate implementing the extension source to body contact structures described herein, provides improved linearity and improved gain, compared to conventional devices. So, as is shown in the graph of FIG. 6, the body contacts described herein provide a net gain for the devices.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    a semiconductor on insulator substrate (SOI) having a doped well region;
    a gate structure formed on the doped well region, the gate structure including a main body having a channel with constant width and a gate extension region extending from the main body;
    a source region on a first side of the main body of the gate structure and a drain region on a side of the main body of the gate structure; and
    a diffusion contact body region abutting the source region of the gate structure adjacent to the channel, and straddling the gate extension region of the gate structure and remote from the channel,
    wherein the gate extension region extends between adjacent contacts which are in the source region.

2. The structure of claim 1, wherein the gate extension region is two gate extension regions.

3. The structure of claim 2, wherein two gate extension regions are separated from one another.

4. The structure of claim 1, wherein the diffusion contact body region comprises a P+ body implant diffusion over the gate extension region between adjacent fingers.

5. The structure of claim 4, wherein the gate extension region and the P+ body implant diffusion are shared amongst adjacent fingers.

6. The structure of claim 4, wherein the P+ body implant diffusion is a body contact.

7. The structure of claim 4, wherein the P+ body implant diffusion and the gate extension region 14' are formed entirely within the doped well region of the SOI.

8. The structure of claim 1, wherein the gate structure is a multi-finger SOI structure, the gate extension region of adjacent fingers join together and the diffusion contact body region is shared amongst adjacent fingers of the multi-finger SOI structure, and each gate extension region of the multi-finger SOI structure share a same source region.

9. The structure of claim 8, wherein the main body of the gate structure is between the source region and the drain region and the gate extension region extends towards the source region and away from the drain region.

10. The structure of claim 8, wherein the diffusion contact body region extends over the source region and the adjacent contacts.

11. The structure of claim 1, wherein:
    the main body of the gate structure is between the source region and the drain region;
    the gate extension region extends towards the source region and away from the drain region;
    the diffusion contact body region extends over the source region and the adjacent contacts; and ends of the main body and the gate extension region extend past different edges of the doped well region.

12. The structure of claim 11, wherein the diffusion contact body region extends past an edge of the doped well region.

13. A structure comprising:
a semiconductor on insulator substrate (SOI) having a doped well region;
a gate structure formed on the doped well region, the gate structure including a main body having a channel with constant width and a gate extension region extending from the main body and away from the channel;
a source region on a first side of the main body of the gate structure and a drain region on a side of the main body of the gate structure; and
a diffusion contact body region abutting the source region of the gate structure adjacent to the channel, and straddling the gate extension region of the gate structure and remote from the channel,
wherein the gate structure is a multi-finger SOI structure, the gate extension region of adjacent fingers are separated from one another and the diffusion contact body region is shared amongst adjacent fingers of the multi-finger SOI structure.

14. The structure of claim 13, wherein the gate extension region has a width larger than a minimum overlay.

15. The structure of claim 13, wherein the gate extension region has a length as small as a minimum lithographic channel length.

16. The structure of claim 13, wherein the diffusion contact body region straddles the gate extension region within the well region.

17. The structure of claim 13, wherein the diffusion contact body region straddles the gate extension region partly outside of the well region.

18. The structure of claim 13, wherein the diffusion contact body region is spaced larger than a lithographic overlay from the channel.

19. The structure of claim 13, wherein the main body of the gate structure is between the source region and the drain region and the gate extension region extends towards the source region and away from the drain region.

20. The structure of claim 19, wherein the gate extension region and the source region are both shared amongst each finger of the multi-finger SOI structure.

* * * * *